United States Patent
Ahn et al.

Patent Number: 5,345,461
Date of Patent: Sep. 6, 1994

[54] SEMICONDUCTOR LASER HIGH OPTICAL GAIN QUANTUM WELL

[75] Inventors: Do Y. Ahn, Kyungki; Tae K. You, Seoul, both of Rep. of Korea

[73] Assignee: Goldstar Co., Ltd., Seoul, Rep. of Korea

[21] Appl. No.: 974,058

[22] Filed: Nov. 13, 1992

[30] Foreign Application Priority Data

Dec. 30, 1991 [KR] Rep. of Korea ............... 25538/1991

[51] Int. Cl.$^5$ ............................................. H01S 3/19
[52] U.S. Cl. ...................................................... 372/45
[58] Field of Search ...................................... 372/43–47

[56] References Cited

U.S. PATENT DOCUMENTS

| | | | |
|---|---|---|---|
| 5,023,879 | 6/1991 | Wang et al. | 372/43 |
| 5,033,053 | 7/1991 | Shimizu et al. | 372/46 X |
| 5,126,803 | 6/1992 | Hager et al. | 372/45 X |
| 5,187,715 | 2/1993 | Weisbuch et al. | 372/46 |
| 5,224,114 | 6/1993 | Ikeda et al. | 372/45 |

OTHER PUBLICATIONS

Optical Gain Control Model of the Quantum-Well Laser Diode, D. Ahn et al., J. Appl. Phys. 70(10):5246–5253 (1991, Nov.)

*Primary Examiner*—John D. Lee
*Attorney, Agent, or Firm*—Finnegan, Henderson, Farabow, Garrett & Dunner

[57] ABSTRACT

A semiconductor laser including an n-type GaAs substrate, an n-type clad layer formed over the substrate, an undoped AlGaAs active layer formed over the clad layer, the active layer having a varying aluminum content depending on the level therein, to form predetermined asymmetric quantum wells, a p-type clad layer formed over the active layer, and a p-type cap layer formed over the p-type clad layer. The active layer has a lower surface constituted by $Al_yGa_{1-y}As$ having a low aluminum content and an upper surface constituted by $Al_zGa_{1-z}As$ having a high aluminum content, and the aluminum content of the AlGaAs of the active layer present between the lower and upper surfaces increases gradually, while the AlGaAs of both types of the clad layers includes $Al_xGa_{1-x}As$ having an aluminum content higher than that of the active layer, to form an asymmetric graded quantum well structure. The AlGaAs of the active layer includes $Al_yGa_{1-y}As$ having a low aluminum content, while the AlGaAs of both types of the clad layers includes $Al_xGa_{1-x}As$ having a high aluminum content, to form an asymmetric stepped quantum well structure.

18 Claims, 4 Drawing Sheets

SEMICONDUCTOR LASER HIGH OPTICAL GAIN QUANTUM WELL

BACKGROUND OF THE INVENTION

1. Field of the Invention

The present invention relates to a semiconductor laser, and more particularly to a semiconductor laser having an active layer with an asymmetric quantum well structure capable of improving an optical gain for a drive current-photo conversion.

2. Description of the Prior Art

Referring to FIGS. 1a to 1c, a semiconductor laser is illustrated having a double hereto (DH) structure.

As shown in FIG. 1a, the semiconductor laser comprises an n-type GaAs substrate 1 and an n-type clad layer 2 formed over the n-type substrate 1 to have a thickness of 1.0 μm. The n-type clad layer 2 is made of $Al_xGa_{1-x}As$. Over the n-type clad layer 2 is formed an active layer 3 which has a thickness of 250 Å or less and is not doped with an impurity ion. The undoped active layer 3 is made of $Al_yGa_{1-y}As$. Over the active layer 3, a p-type clad layer 4 having a thickness of 1.0 μm is formed which is made of $Al_xGa_{1-y}As$, similar to the n-type clad layer 2. The semiconductor laser also comprises a p-type cap layer 5 formed over the p-type clad layer 4 and made of GaAs.

In FIG. 1a, the reference, character $G^-$ denotes a p-type electrode formed at the lower surface of the substrate. 1 and the reference character $G^+$ denotes an n-type electrode formed at the upper surface of the p-type cap layer 5.

In FIG. 1c, the reference character W1 denotes the thickness of the active layer 3. In the illustrated structure, the thickness W1 of the active layer 3 is not more than about 250 Å. With this thickness W1 of active layer 3, the semiconductor laser has improvements in optical gain characteristic and thermal characteristic.

The semiconductor laser with the above-mentioned DH structure exhibits an optical gain characteristic and a thermal characteristic which are two or three times the semiconductor lasers having a general type DH structure in which an active layer has a thickness of about 1,000 Å.

FIG. 1b is a partial sectional view of the semiconductor laser shown in FIG. 1a. FIG. 1c is a diagram showing energy bands and quantum wells in the structure shown in FIG. 1b. As above-mentioned, the undoped active layer 3 made of $Al_yGa_{1-y}As$ a the thickness of not more than 250 Å, so that aluminum is uniformly distributed in the active layer 3. As a result, symmetric quantum wells are formed with reference to the center of the active layer 3.

The content of aluminum in the n-type clad layer 2 made of $Al_xGa_{1-x}As$, the p-type clad layer 4 made of $Al_xGa_{1-x}As$, and the undoped active layer 3 made of $Al_yGa_{1-y}As$ interposed therebetween is determined by the following equation:

$$x = y + 0.3 \quad (1)$$

As shown in FIG. 1c, the band gap Ex between the conduction band Ec and the valence electron band Ev, that is, an energy gap between the n-type clad layer 2 and the p-type clad layer 4 is larger than the band gap Ey of the active layer 3, since the clad layers 2 and 4 have an aluminum content larger than that of the active layer 3. As a result, the semiconductor layer has a symmetric type quantum well structure.

In conventional semiconductor lasers with such a symmetric quantum structure, the band gap Ey of the active layer 3 having a thickness of 60 Å to 150 Å and the band gap Ex between the n-type clad layer 2 and the p-type clad layer 4 are about 0.2 eV to about 0.3 eV.

Positive and negative voltages are applied to the p-type electrode $G^+$ and the n-type electrode $G^-$ of the conventional semiconductor laser with the above-mentioned symmetric quantum well structure, respectively, to supply a current to the semiconductor laser. Electrons and holes are present in limited numbers in regions S1 and S1' predetermined in two quantum wells as shown in FIG. 1c, respectively. As the electrons and holes in the regions S1 and S1' are recombined, laser beams are emitted.

As mentioned above, the semiconductor laser with the quantum well structure has an advantage of increasing the electron-hole coupling effect, in that the electrons and holes are present in limited numbers in the quantum wells effectively. Accordingly, the optical gain characteristic for a drive current-photo conversion is improved.

However, the conventional semiconductor laser with the symmetric quantum well structure is subjected to a strict quantum mechanical selection condition, due to the intrinsic symmetry of its structure. That is, the transition of electrons and holes contributing to the optical gain is possible under the condition that the quantum wells are filled to a predetermined level with the electrons and holes, respectively.

Such a strict quantum mechanical selection condition determines the upper limit of optical gain obtained in the conventional semiconductor laser with the quantum well structure. As a result, a limitation exists in obtaining a high optical gain. Due to a low optical gain, it is difficult for the semiconductor laser to improve in reliance, for example, a high low-current operation characteristic and a good thermal characteristic.

SUMMARY OF THE INVENTION

Therefore, an object of the invention is to eliminate the above-mentioned disadvantage encountered in the prior art and to provide a semiconductor laser comprising an active layer with an asymmetric quantum structure enabling the transition of electrons and holes even when quantum wells are filled to a low level with the electrons and holes, thereby obtaining an increase in optical gain characteristic.

In accordance with the present invention, this object can be accomplished by providing a semiconductor laser comprising: a first compound semiconductor layer of a first conductivity type as a substrate; a second compound semiconductor layer of the first conductivity type as a clad layer formed over the first compound semiconductor layer; a third compound semiconductor layer of a non-conductivity type as an active layer formed over the second compound semiconductor layer, the third compound semiconductor layer having a metal content, the metal content being varied depending on the level therein, to form predetermined asymmetric quantum wells; a fourth compound semiconductor layer of a second conductivity type as another clad layer formed over the third compound semiconductor layer; and a fifth compound semiconductor layer of the second conductivity type as a cap layer formed over the fourth compound semiconductor layer.

BRIEF DESCRIPTION OF THE DRAWINGS

Other objects and aspects of the invention will become apparent from the following description of embodiments with reference to the accompanying drawings in which:

FIG. 1b is a partial sectional view of the semiconductor laser shown in FIG. 1a;

Figure 2A:
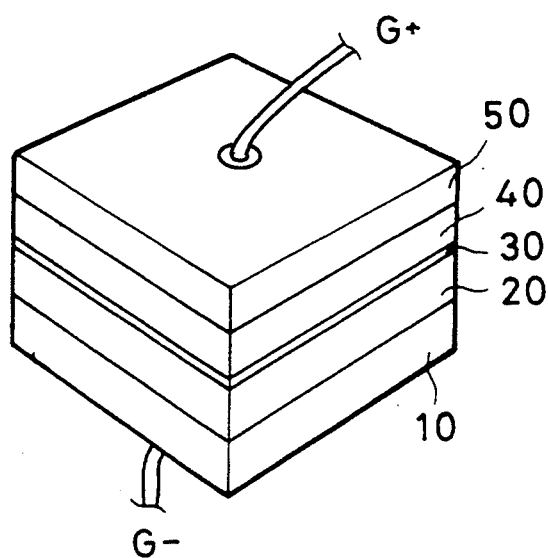
FIG. 2a is a perspective view of a semiconductor laser in accordance with an embodiment of the present invention.
Figure 2B:
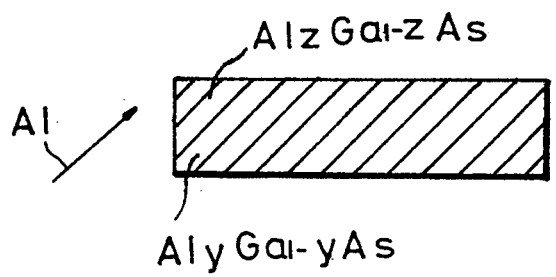
Figure 2C:
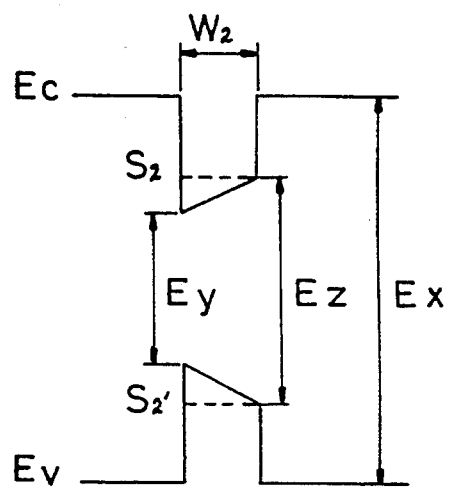
Figure 3A:
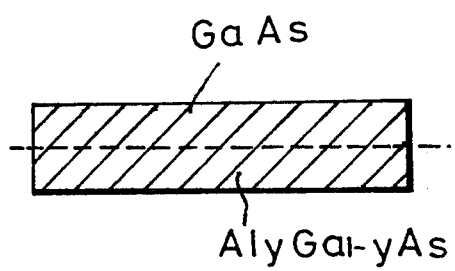
Figure 3B:
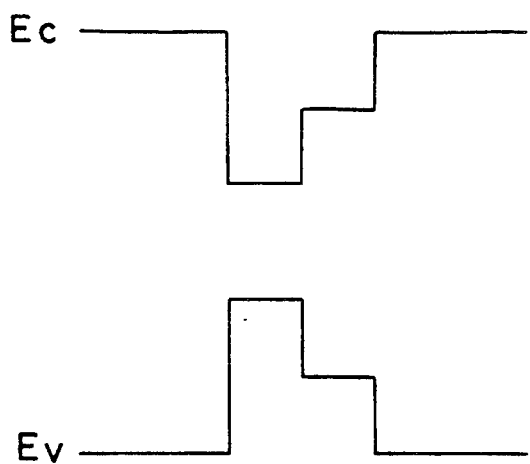
Figure 4:
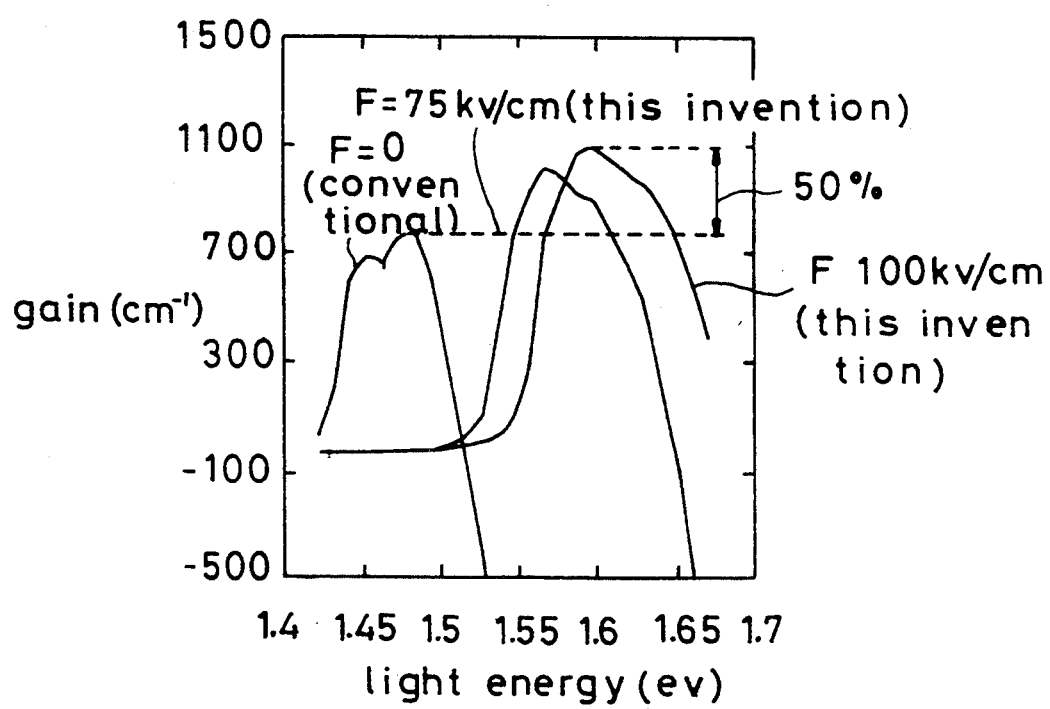

FIG, 2b is a diagram explaining the distribution aluminum in an active layer of the semiconductor laser shown in FIG. 2a;

FIG. 2c is a diagram showing energy band and quantum wells in the semiconductor laser shown in FIG. 2b;

FIG. 3a is a diagram explaining the distribution of aluminum in an active layer in accordance with another embodiment of the present invention;

FIG. 3b is a diagram showing an energy band and quantum wells in the structure shown in FIG. 3a; and FIG. 4 is a graph showing an optical gain obtained in the semiconductor laser according to the present invention and an optical gain obtained in the conventional semiconductor laser.

DETAILED DESCRIPTION OF THE PREFERRED EMBODIMENTS

Figure 1A:
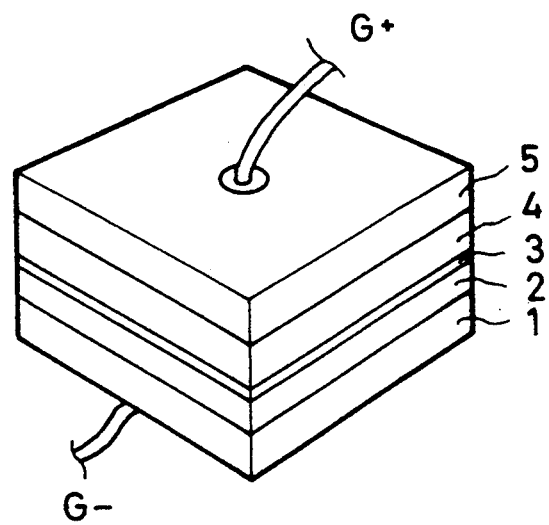
FIG. 1a is a perspective view of a conventional semiconductor laser.
Figure 1B:
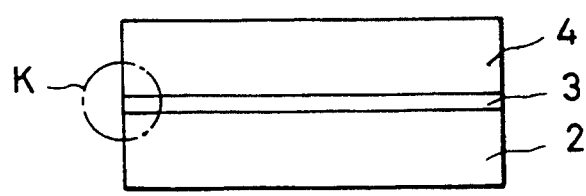
Figure 1C:
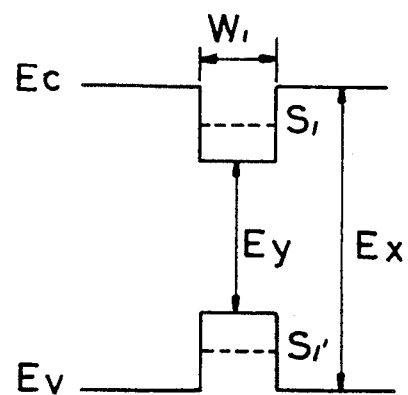
FIG. 1c is a diagram showing an energy bands and quantum wells in a region k shown in FIG. 1b.

Referring to FIG. 2a, a semiconductor laser is illustrated in accordance with an embodiment of the present invention. FIG. 2b is a diagram explaining the distribution of aluminum contained in a compound semiconductor layer as an active layer in the structure shown in FIG. 1a. On the other hand, FIG. 2c is a diagram showing an energy bands and quantum wells in the structure shown in FIG. 2a.

As shown in FIG. 2a, the semiconductor laser according to the present invention comprises an n-type GaAs substrate 10 and an n-type clad layer 20 formed over the n-type substrate 10 and made of $Al_xGa_{1-x}As$. Over the n-type clad layer 20 an active layer 30 made of an undoped compound semiconductor is formed. Over the active layer 30, a p-type clad layer 40 made of $Al_xGa_{1-x}As$, similar to the n-type clad layer 20 is formed. The semiconductor laser also comprises a p-type cap layer 50 formed over the p-type clad layer 40 and made of GaAs.

In FIG. 2a, the reference character G⁻ denotes a p-type electrode formed at the lower surface of the substrate 10 and the reference character G⁺ denotes an n-type electrode formed at the upper surface of the p-type cap layer 50.

In FIG. 2c, the reference character W2 denotes the thickness of the active layer 30. In the illustrated structure, the active layer 30 made of the compound semiconductor has an aluminum content, which gradually varies depending on the level in the active layer 30, is not more than about 250 Å. Accordingly, asymmetric quantum wells are formed with respect to the center of the active layer 30.

That is, the content of aluminum in the active layer 30 increases gradually from y to z in a direction indicated by an arrow in FIG. 2b, as the level in the active layer 30 increases. In accordance with the present invention, the thickness W2 of active layer 30 is about 80 Å to about 100 Å.

With this active layer 30, the semiconductor laser of the present invention has the asymmetric quantum well structure near the active layer 30.

In accordance with the present invention, aluminum in the compound AlGaAs constituting the active layer 30 is distributed in the active layer 30. The aluminum content varies depending on the level in the active layer 30, according to the following equation:

$$z = y + 0.2 \quad (2)$$

That is, the active layer 30 has a lower surface constituted by $Al_yGa_{1-y}As$ and an upper surface constituted by $Al_zGa_{1-z}As$. The content of aluminum between the lower and upper surfaces of the active layer 30 increases gradually.

Accordingly, the quantum walls formed at the active layer 30 becomes a graded type. These graded quantum wells are asymmetric with reference to the center of the active layer 30, as shown in FIG. 2c.

As shown in FIG. 2c, the active layer 30 has the smallest band gap Ey formed at its portion having a minimum aluminum content and a band gap Ez formed at its portion having a maximum aluminum content. Thus, band gap Ez is band gap Ey since graded quantum wells are formed asymmetrically with reference to the center of the active layer 30.

A band gap Ex is formed between the n-type and p-type clad layers 20 and 40 made of $Al_xGA_{1-x}As$. Band gap Ex is larger than band gaps Ey and Ez since the n-type and p-type clad layers 20 and 40 have an aluminum content larger than that of the active layer 30.

Respective content ratios of aluminum contained in the AlGaAs compound semiconductor materials constituting the n-type clad layer 40, the active layer 30 and the n-type clad layer 20 are as follows:

y = 0 to 0.1,
z = 0.2 to 0.3, and
x = 0.3 to 0.6

At these aluminum content ratios, the semiconductor laser with the asymmetric graded quantum well structure is obtained in accordance with the present invention.

A limitation on transitions of electrons and holes for obtaining an optical gain, due to quantum mechanical selection condition, does not exist layer 30 of the above-mentioned semiconductor laser. This is because the graded quantum wells are asymmetric with respect to the growth direction thereof, as shown FIG. 2c. This is also based on the principle of quantum mechanics where the transition of electrons and holes is be possible at all levels where the quantum wells are filled with the electrons electrons and holes, under the condition that the symmetry of quantum wells does not exist.

The "optical gain" is defined as the sum of respective squares of dipole matrixes at states which enable the transition of electrons and holes. Accordingly, it is natural that since squares of dipole matrixes at all states are summed, the semiconductor laser of the present invention has an optical gain higher than that of the conventional layer having a symmetric quantum well structure where quantum mechanical selection condition is subjected to limitation.

Referring to FIG. 3a, an active layer structure of a semiconductor laser is illustrated having an asymmetric stepped quantum well structure in accordance with another embodiment of the present invention. FIG. 3b shows corresponding energy bands quantum wells of the structure shown in FIG. 3a.

As shown in FIG. 3a, the active layer 30 has two portions disposed above and beneath the central portion thereof when and made of different compound semiconductors, to form an asymmetric stepped quantum well structure. This asymmetric stepped quantum well structure makes it possible to increase the optical gain.

For example, where the active layer 30 is interposed between a p-type clad layer made of $Al_xGA_{1-x}As$ and an n-type clad layer made of $Al_xGa_{1-x}As$, the actual layer 30 has a lower surface constituted by GaAs and an upper surface constituted by $Al_yGa_{1-y}As$. Accordingly, the active layer 30 has different aluminum contents at its upper and lower surfaces.

As a result, the obtained quantum well structure becomes a stepped type which is asymmetric with reference to the center of the active layer 30, as shown in FIG. 3b.

With this asymmetric stepped quantum well structure, the transition of electrons and holes is possible at all states, as a voltage appropriate for the structure is applied thereto. That is, the transition of electrons and holes is possible even at a state where the quantum wells are filled with electrons and holes at a low level. As a result, the optical gain characteristic is improved, over the conventional symmetric type semiconductor lasers.

FIG. 4 a graph showing the optical gain obtained in the semiconductor laser having the asymmetric graded quantum well structure according to the first embodiment of the present invention and the optical gain obtained in the semiconductor laser having the conventional symmetric quantum well structure.

As shown in FIG. 4, with the asymmetric graded quantum well structure at the quantum well thickness of 200 Å, the aluminum content rate of y=0 and z=0, and the graded potential of F=100 kV/cm according to the present invention, the maximum value of the optical gain obtained in the semiconductor laser is increased by about 50% as compared with the maximum value of the optical gain obtained in the semiconductor laser with the conventional symmetric quantum well structure at the graded potential of F=0 kV/cm.

The structures of the embodiments of present invention and effects thereof have been disclosed in detail in "Optical Gain Control Model of the Quantum Well Laser Diode", 91. 11, Journal of Applied Physics.

As apparent from the above description, the present invention provides a semiconductor laser with asymmetric graded quantum wells or asymmetric stepped quantum wells enabling concentrations of electrons and holes in the quantum wells and thus allowing transitions of electrons and holes at any state. Accordingly, it is possible to increase the electron-hole coupling effect. As a result, the optical gain obtained in the semiconductor laser of the present invention is improved by about 50%, over the conventional semiconductor lasers. Furthermore, with the present invention it is possible to improve the low-current operation, the thermal characteristic and the reliance of the semiconductor laser.

Although the preferred embodiments of the invention have been disclosed for illustrative purpose, those skilled in the art will appreciate that various modifications, additions and substitutions are possible, without departing from the scope and spirit of the invention as disclosed in the accompanying claims.

What is claimed is:

1. A semiconductor laser comprising:
    a first compound semiconductor layer of a first conductivity type as a substrate;
    a second compound semiconductor layer of the first conductivity type as a first clad layer disposed over the first compound semiconductor layer;
    a third compound semiconductor layer of a non-conductive type as an active layer disposed over the second compound semiconductor layer, the third compound semiconductor layer having asymmetric quantum wells;
    a fourth compound semiconductor layer of a second conductivity type as a second clad layer disposed over the third compound semiconductor layer; and
    a fifth compound semiconductor layer of the second conductivity type as a cap layer disposed over the fourth compound semiconductor layer.

2. A semiconductor laser in accordance with claim 1, further comprising a pair of electrodes provided at an upper surface of the fifth compound semiconductor layer and a lower surface of the first compound semiconductor layer, respectively, the electrodes supplying a drive voltage to the semiconductor laser.

3. A semiconductor laser in accordance with claim 1, wherein the first compound semiconductor layer as the substrate and the fifth compound semiconductor layer as the cap layer are made of GaAs, and the second compound semiconductor layer as the first clad layer, the third compound semiconductor layer as the active layer, and the fourth compound semiconductor layer as the second clad layer are made of AlGaAs.

4. A semiconductor laser in accordance with claim 3, wherein the active layer includes a lower surface constituted by $Al_yGa_{1-y}As$ having an aluminum content and an upper surface constituted by $Al_zGa_{1-z}As$ having an aluminum content higher than the aluminum content of the lower surface, and an aluminum content of the AlGaAs present between the lower and upper surfaces of the active layer increases gradually, and the AlGaAs of both the first and second clad layers comprises $Al_xGa_{1-x}As$ having an aluminum content higher than that of the active layer to form an asymmetric graded quantum well structure, where x, y and z are content ratios.

5. A semiconductor laser in accordance with claim 4, wherein the y, the z and the x are approximately in ranges of 0 to 0.1, 0.1 to 0.3, and 0.3 to 0.6, respectively.

6. A semiconductor laser in accordance with claim 1, wherein the first compound semiconductor layer as the substrate and the fifth compound semiconductor layer as the cap layer are made of GaAs, the second compound semiconductor layer as the first clad layer and the fourth compound semiconductor layer as the second clad layer are made of AlGaAs, and the third compound semiconductor layer as the active layer is made of GaAs—AlGaAs.

7. A semiconductor laser in accordance with claim 6, wherein the AlGaAs of the active layer comprises $Al_yGa_{1-y}As$ having an aluminum content, and the AlGaAs of both the first and second clad layers comprises $Al_xGa_{1-x}As$ having an aluminum content higher than the aluminum content of the active layer, to form an asymmetric stepped quantum well structure, where x and y are content ratios.

8. A semiconductor laser in accordance with claim 7, wherein the y and the x are approximately in ranges of b 0 to 0.1 and 0.3 to 0.6, respectively.

9. A semiconductor laser in accordance with claim 1, wherein the third compound semiconductor layer has a varying metal content.

10. A semiconductor laser comprising:
a first compound semiconductor layer of a first conductivity type as a substrate;
a second compound semiconductor layer of the first conductivity type as a first clad layer disposed over the first compound semiconductor layer;
a third compound semiconductor layer of a non-conductive type quantum well, as an active layer, disposed over the second compound semiconductor layer, the active layer having a gradual change in composition between an upper surface and a lower surface of the active layer;
a fourth compound semiconductor layer of a second conductivity type as a second clad layer disposed over the third compound semiconductor layer; and
a fifth compound semiconductor layer of the second conductivity type as a cap layer disposed over the fourth compound semiconductor layer.

11. A semiconductor laser in accordance with claim 10, further comprising a pair of electrodes provided at an upper surface of the fifth compound semiconductor layer and a lower surface of the first compound semiconductor layer, respectively, the electrodes supplying a drive voltage to the semiconductor laser.

12. A semiconductor laser in accordance with claim 10, wherein the first compound semiconductor layer as the substrate and the fifth compound semiconductor layer as the cap layer are made of GaAs, and the second compound semiconductor layer as the first clad layer, the third compound semiconductor layer as the active layer, and the fourth compound semiconductor layer as the second clad layer are made of AlGaAs.

13. A semiconductor laser in accordance with claim 12, wherein the active layer includes a lower surface constituted by $Al_yGa_{1-y}As$ having an aluminum content and an upper surface constituted by $Al_zGa_{1-z}As$ having an aluminum content higher than the aluminum content of the lower surface, and an aluminum content of the AlGaAs present between the lower and upper surfaces of the active layer increases gradually, and the AlGaAs of both the first and second clad layers comprises $Al_xGa_{1-x}As$ having an aluminum content higher than that of the active layer to form an asymmetric graded quantum well structure, where x, y and z are content ratios.

14. A semiconductor laser in accordance with claim 13, wherein the y, the z and the x are approximately in ranges of 0 to 0.1, 0.1 to 0.3, and 0.3 to 0.6, respectively.

15. A semiconductor laser in accordance with claim 10, wherein the first compound semiconductor layer as the substrate and the fifth compound semiconductor layer as the cap layer are made of GaAs, the second compound semiconductor layer as the first clad layer and the fourth compound semiconductor layer as the second clad layer are made of AlGaAs, and the third compound semiconductor layer as the active layer is made of GaAs—AlGaAs.

16. A semiconductor laser in accordance with claim 15, wherein the AlGaAs of the active layer comprises $Al_yGa_{1-y}As$ having an aluminum content, and the AlGaAs of both the first and second clad layers comprises $Al_xGa_{1-x}As$ having an aluminum content higher than the aluminum content of the active layer, to form an asymmetric stepped quantum well structure, where x and y are content ratios.

17. A semiconductor laser in accordance with claim 16, wherein the y and the x are approximately in ranges of 0 to 0.1 and 0.3 to 0.6, respectively.

18. A semiconductor laser in accordance with claim 10, wherein the third compound semiconductor layer has a varying metal content.

* * * * *

UNITED STATES PATENT AND TRADEMARK OFFICE
CERTIFICATE OF CORRECTION

PATENT NO. : 5,345,461
DATED : September 6, 1994
INVENTOR(S) : Do Y. AHN and Tae K. YOU It is certified that error appears in the above-indentified patent and that said Letters Patent is hereby corrected as shown below:

Item [54], and col. 1, change "SEMICONDUCTOR LASER HIGH OPTICAL GAIN QUANTUM WELL" to --HIGH OPTICAL GAIN QUANTUM WELL SEMICONDUCTOR LASER--.

Claim 8, column 6, line 68, change "bo" to --0--

Signed and Sealed this

Fourteenth Day of February, 1995

Attest:

BRUCE LEHMAN

*Attesting Officer*     *Commissioner of Patents and Trademarks*